(12) United States Patent
Tchoul

(10) Patent No.: US 9,349,921 B2
(45) Date of Patent: May 24, 2016

(54) INDEX MATCHED COMPOSITE MATERIALS AND LIGHT SOURCES INCORPORATING THE SAME

(71) Applicant: Maxim Tchoul, Beverly, MA (US)

(72) Inventor: Maxim Tchoul, Beverly, MA (US)

(73) Assignee: OSRAM SYLVANIA Inc., Wilmington, MA (US)

( * ) Notice: Subject to any disclaimer, the term of this patent is extended or adjusted under 35 U.S.C. 154(b) by 0 days.

(21) Appl. No.: 14/434,224

(22) PCT Filed: Oct. 17, 2013

(86) PCT No.: PCT/US2013/065351
§ 371 (c)(1),
(2) Date: Apr. 8, 2015

(87) PCT Pub. No.: WO2014/062871
PCT Pub. Date: Apr. 24, 2014

(65) Prior Publication Data
US 2015/0236213 A1 Aug. 20, 2015

Related U.S. Application Data

(60) Provisional application No. 61/716,141, filed on Oct. 19, 2012.

(51) Int. Cl.
*H01L 29/88* (2006.01)
*H01L 29/861* (2006.01)
(Continued)

(52) U.S. Cl.
CPC . *H01L 33/44* (2013.01); *C09K 5/14* (2013.01); *C09K 11/025* (2013.01); *C09K 11/7734* (2013.01); *C09K 11/7774* (2013.01); *C09K 11/7792* (2013.01)

(58) Field of Classification Search
CPC .............. H01L 21/0672; H01L 21/02345; H01L 21/02178; H01L 21/02642; H01L 21/02172; H01L 21/102129; H01L 21/3141; H01L 21/31641; H01L 27/0814; H01L 29/6603; H01L 51/0034; H01L 51/00432; H01L 51/5296
USPC ........... 257/79, 204, 288, 428, 643, 760, 431, 257/E21.006, E21.007, E21.053, E21.126, 257/E21.127, E21.138, E21.172, E21.267, 257/E21.253, 21.328, E21.347, 21.352, 257/E21.366, E21.328, E21.352
See application file for complete search history.

(56) References Cited

U.S. PATENT DOCUMENTS 7,572,874 B2 * 8/2009 Matyjaszewski ......... C08F 4/00
526/329.7
8,368,106 B2 * 2/2013 Jang ....................... B82Y 20/00
257/98

(Continued)

FOREIGN PATENT DOCUMENTS

WO    WO 2007/078262    7/2007
WO    WO 2009/023353    2/2009
(Continued)

OTHER PUBLICATIONS

PCT Search Report, PCT/US2013/065351.
(Continued)

*Primary Examiner* — David Nhu
(74) *Attorney, Agent, or Firm* — Robert F. Clark

(57) ABSTRACT

Disclosed are composites that include a matrix and at least one filler. The matrix may be a core-shell particle assembly that includes an inorganic core and a polymeric shell. The refractive index of the core may be adjusted by adjusting the volume fraction of the core, such that the refractive index of the core-shell particle assembly matches or substantially matches the refractive index of the filler. Optically transparent composites that exhibit properties of the filler may therefore be achieved. Methods of making such composites and light sources including such composites are also disclosed.

16 Claims, 5 Drawing Sheets

(51) Int. Cl.
*H01L 33/44* (2010.01)
*C09K 5/14* (2006.01)
*C09K 11/77* (2006.01)
*C09K 11/02* (2006.01)

(56) References Cited

U.S. PATENT DOCUMENTS

| | | | | |
|---|---|---|---|---|
| 8,405,063 | B2 * | 3/2013 | Kazlas | H05B 33/145 257/9 |
| 8,865,797 | B2 * | 10/2014 | Matyjaszewski | C08F 265/04 523/205 |
| 8,921,827 | B2 * | 12/2014 | Pickett | B82Y 15/00 257/98 |
| 9,142,732 | B2 * | 9/2015 | Luo | H01L 33/504 |
| 9,193,833 | B2 * | 11/2015 | Goto | C08G 77/395 |

| | | |
|---|---|---|
| 2010/0123155 A1 | 5/2010 | Pickett et al. |
| 2010/0249271 A1 | 9/2010 | Matyjaszewski et al. |
| 2012/0112219 A1 | 5/2012 | Jang et al. |
| 2013/0125365 A1 | 5/2013 | Goto et al. |

FOREIGN PATENT DOCUMENTS

| | | |
|---|---|---|
| WO | WO 2011/102272 | 8/2011 |
| WO | WO 2014/062871 | 4/2014 |

OTHER PUBLICATIONS

Tao et al., $TiO_2$ nanocomposites with high refractive index and transparency, J. Mater. Chem 21 (2011) 18623-18629.

Tchoul et al., Assemblies of Titanium Dioxide-Polystyrene Hybrid Nanoparticles for Dielectric Applications, Chemistry of Materials, vol. 22, (2010) 1749-1759.

* cited by examiner

INDEX MATCHED COMPOSITE MATERIALS AND LIGHT SOURCES INCORPORATING THE SAME

CROSS REFERENCES TO RELATED APPLICATIONS

This application is a U.S. National Stage application of, and claims the benefit of, International Application No. PCT/US2013/065351, filed Oct. 17, 2013, which claims the benefit of U.S. Provisional Application No. 61/716,141, filed Oct. 19, 2012.

FIELD

The present disclosure generally relates to composite materials and, more particularly, to composite materials that include at least one core-shell particle assembly and at least one filler.

BACKGROUND

Light Emitting diodes (hereafter, "LED," or "LEDs") can generate visible or non-visible light in a specific region of the light spectrum. The light output from an LED may be, for example, light in the blue, red, green, non-visible ultra-violet (UV), and/or near-UV light, depending on the material composition of the LED. When it is desired to construct an LED light source that produces an emission color different from the output color of the LED, it is known to convert the light output from an LED having a first wavelength or wavelength range (i.e., "primary light" or "excitation light") to light having a second wavelength or wavelength range (i.e, "secondary light" or "emission light") using photoluminescence.

Photoluminescence generally involves absorbing higher energy primary light with a wavelength-conversion material such as a phosphor or mixture of phosphors. Absorption of the primary light can excite the wavelength-conversion material to a higher energy state. When the wavelength-conversion material returns to a lower energy state, it emits secondary light, generally of a different and longer wavelength/wavelength range than the primary light. The wavelength/wavelength range of the secondary light can depend on the type of wavelength-conversion material used. As such, secondary light of a desired wavelength/wavelength range may be attained by proper selection of wavelength-conversion material. This process may be understood as "wavelength down conversion," and an LED combined with a wavelength-conversion structure that includes wavelength-conversion material, such as phosphor, to produce secondary light, may be described as a "phosphor-converted LED" or "wavelength-converted LED."

In a known configuration, an LED die such as a III-nitride die is positioned in a reflector cup package and a volume, and a conformal layer or thin film of or including wavelength-conversion material is deposited directly on the surface of the die. In another known configuration, the wavelength-conversion material may be provided in a solid, self-supporting flat structure, such as a ceramic plate, a filled polymer material (e.g., polymer matrix filled with phosphor particles, a single crystal plate or thin film structure. Such a plate may be referred to herein as a "wavelength-conversion plate." In any case, structures containing wavelength-conversion material that are attached directly to the LED die, e.g. by coating, wafer bonding, sintering, gluing, etc. may be understood as being in a "chip level conversion" configuration or "CLC." Alternatively, structures containing wavelength-conversion material that are positioned remotely from the LED die may be understood as being in a "remote conversion" configuration.

Polymer-phosphor composites have been proposed for use as wavelength-conversion structures in LED light sources. Such composites generally include particles of one or more wavelength-conversion materials such as a phosphor (e.g., yellow phosphor, green phosphor, red phosphor, etc.) that are dispersed or otherwise loaded in a polymeric matrix, such as silicone. In many instances, the polymers used in such composites have a refractive index ranging from 1.3 to 1.6, whereas wavelength-converting phosphor fillers have a refractive index ranging from 1.7 to 1.9. The difference in refractive index between the polymeric matrix and the filler can cause significant scattering of light within a polymer-phosphor composite, and may result in the loss of light at the phosphor-polymer interfaces due to high total internal reflection (TIR). As a result, the optical transparency of such polymer-phosphor composites may be low, and may render such composites undesirable for use as a wavelength-conversion material in a lighting system.

In addition, heat (e.g., Stokes heat) is generated when a wavelength conversion material such as a phosphor converts primary light to secondary light. Due to their relatively low thermal conductivity, polymer-phosphor composites may not sufficiently remove heat generated by the phosphor particles during the conversion process. This may cause the phosphor particles to overheat, potentially lowering their efficacy. Excess heat may also contribute to the degradation of the phosphor particles and/or the polymeric matrix material.

Accordingly, while known polymer-phosphor composites may be useful for some applications, their usefulness in lighting applications may be limited due to their low optical transparency and/or low thermal conductivity.

BRIEF DESCRIPTION OF THE DRAWINGS

Reference should be made to the following detailed description which should be read in conjunction with the following figures, wherein like numerals represent like parts.

Figure 1:
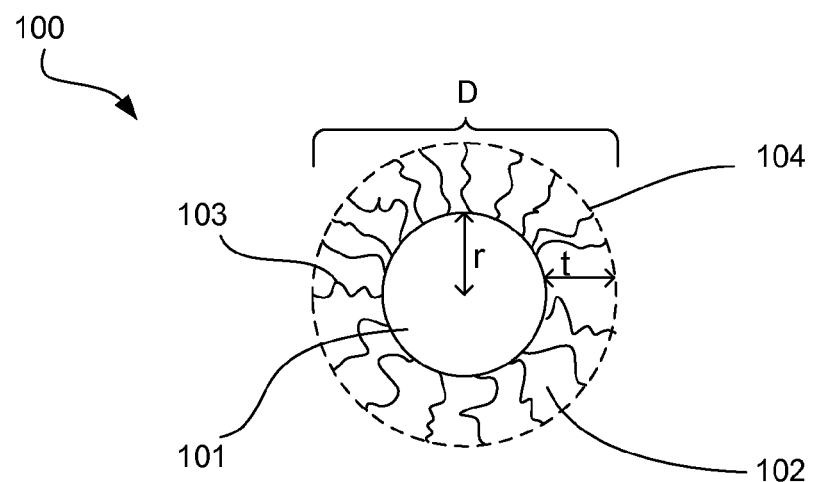
FIG. 1 illustrates in cross section an exemplary core-shell particle consistent with the present disclosure.

For a thorough understanding of the present disclosure, reference should be made to the following detailed description, including the appended claims, in connection with the above-described drawings. Although the present disclosure is described in connection with exemplary embodiments, the disclosure is not intended to be limited to the specific forms set forth herein. It is understood that various omissions and substitutions of equivalents are contemplated as circumstances may suggest or render expedient. Also, it should be understood that the phraseology and terminology used herein is for the purpose of description and should not be regarded as limiting, except as otherwise expressly indicated.

DETAILED DESCRIPTION

As used herein, the term "about" when used in connection with a numerical value or range means +/−5% of the recited numerical value or range.

From time to time, one or more aspects of the present disclosure may be described using a numerical range. Unless otherwise indicated herein, any recited range should be interpreted as including any iterative values between indicated endpoints, as if such iterative values were expressly recited. Such ranges should also be interpreted as including any and all ranges falling within or between such iterative values and/or recited endpoints, as if such ranges were expressly recited herein.

References to the color of a phosphor, LED or conversion material refer generally to its emission color unless otherwise specified. Thus, a blue LED emits a blue light, a yellow phosphor emits a yellow light and so on.

As used herein, the term "core-shell particle" means particles having an inorganic core and a polymeric shell attached to the core.

The term "core-shell particle assembly" is used herein to refer to a material formed from a plurality of core-shell particles that are mechanically or chemically bound to one another. In some embodiments, the core-shell particle assemblies described herein are formed a plurality of core-shell particles that are mechanically bound to one another, e.g., by entanglement of polymer chains in the polymeric shells of respective particles. Alternatively or additionally, the core-shell assemblies described herein may be formed by covalent and/or ionic bonding between constituents of adjacent particles, e.g., polymers in the polymeric shell. While the present disclosure envisions embodiments wherein a core-shell particle assembly is formed solely of core-shell particles, in some embodiments the core-shell particle assembly may contain a residual amount of one or more dispersing agents in addition to one or more types of core-shell particle. For example, a core-shell particle assembly may contain less than or equal to about 5% by weight, such as less than or equal to about 1%, or even less than or equal to 0.5 weight % of a dispersing agent. In one non-limiting embodiment, the core-shell particle assemblies described herein consist or consist essentially of core-shell particles.

As used herein, "consists essentially of core-shell particles" means that a core-shell particle assembly may include components that do not affect the refractive index of the core-shell particle assembly. Such components should be understood as being distinct from fillers and other materials that may be added to a core-shell particle assembly to form a composite consistent with the present disclosure, and which may or may not impact the refractive index of the composite as a whole.

In view of the aforementioned terminology, one aspect of the present disclosure relates to composites that include a matrix and a filler material. The matrix includes at least one core-shell particle assembly, and the filler includes at least one material that alters or otherwise impacts one or more properties of the composite. For example, the filler may include at least one wavelength conversion material (e.g., for converting primary light emitted by a light source to secondary light). Alternatively or additionally, the filler may have desired thermal properties such as thermal conductivity. In any case, the fillers when added to a core-shell particle assembly may impart desirable properties such as wavelength conversion capability, thermal conductivity, combinations thereof and the like to the resulting composite.

As will be discussed in detail below, the refractive index of the core-shell particle assemblies described herein may be adjusted by controlling one or more physical and/or chemical parameters of the constituent core-shell particles forming the core-shell particle assembly. As a result, the refractive index of the core-shell particle assemblies described herein may be tailored to approximate, match, or substantially match the refractive index of the filler(s) used in the composite. In this way, the composites of the present disclosure may exhibit desired properties (e.g., due to the filler), while maintaining or substantially maintaining one of more of the optical properties of the core-shell particle assembly, such as its optical transparency.

Reference is now made to FIG. 1, which illustrates in cross section the structure of an exemplary core-shell particle consistent with the present disclosure. As shown, core-shell particle 100 includes core 101 and shell 102. In this example, shell 102 is illustrated as including a plurality of polymer chains 103 that are physically and/or chemically bound to the surface (not labeled) of core 101. While polymer chains 103 are preferably covalently bonded to the surface of core 101, other mechanisms for bonding or attaching polymer chains 103 to core 101 are possible. For example, polymer chains 103 may be ionically bound to core 102. Alternatively or additionally, shell 102 may be formed by coating core 101 with a material containing polymer chains 103, which may then remain on the surface of core 101, e.g., via a physical and/or mechanical interaction with such surface.

Regardless of the nature and configuration of core-shell particle 100, the core-shell particles described herein may have a diameter (or particle size) D, as further illustrated in FIG. 1. Core-shell particles of any diameter D may be used in accordance with the present disclosure. In some embodiments, diameter D may range from less than or equal to about 100 nm, such as less than or equal to about 75, less than or equal to about 50 nm, less than or equal to about 25 nm, or even less than or equal to about 10 nm.

Diameter D may be the sum of the radius r of core 101 and the thickness t of shell 102. Although FIG. 1 depicts core-shell particle 100 as including a shell having a thickness t that is less than radius r of core 101, such a configuration should be considered exemplary only. Indeed, core-shell particles with any radius r or thickness t may be used. In some embodiments, radius r and thickness t are chosen such that the calculated volume fraction of core 101 and/or the volume fraction shell 102 fall within a desired range. Indeed, as will be discussed in detail below in connection with FIGS. 3 and 4, the volume fraction of core 101 (and thus, of shell 102) can impact the refractive index of a core-shell particle, and thus can also impact the refractive index of core-shell particle assemblies consistent with the present disclosure.

For the sake of illustration, FIG. 1 illustrates core-shell particle 100 as a generally spherical particle that includes a spherical core 101 and shell 102. While the present disclosure envisions core-shell particles that are consistent with the configuration shown in FIG. 1, it should be understood that other configurations are possible. For example, core 101 may have a non-spherical shape, such as a cylindrical, fibrous, irregular, oblong, platelet, rod, or spheroidal shape, combinations thereof, and the like.

Further, while the thickness of shell 102 may be uniform around core 101 as shown in FIG. 1, such a configuration is for the sake of illustration only and is not required. Indeed, shell 102 may have a thickness that varies locally around the perimeter of core 101, resulting in a core-shell particle with an irregular shell thickness. In any case, the thickness of shell 102 may be determined by the length of polymer chains 103 and/or the amount of polymeric material (containing polymeric chains 103) that is deposited core 101. This concept is illustrated in FIG. 1, wherein border 104 is shown with a hashed line. In some embodiments, the thickness of shell 102 is uniform or substantially uniform about core 101. In such instances, polymeric chains 103 may be formed such they are of the same or substantially the same length, and hence, the same or substantially the same molecular weight.

The thickness t of shell 102 may range, for example, from about 1 to about 60 nm. In some embodiments, the thickness t of shell 102 ranges from about 10 to about 50 nm, about 10 to about 40 nm, or even about 10 to about 30 nm.

Core-shell particle 100 as a whole may have any desired shape. For example, core-shell particle 100 may have a cylindrical, fibrous, irregular, oblong, platelet, rod, spherical, or spheroidal shape, combinations thereof, and the like. Without limitation, core-shell particle 100 is preferably spherical or spheroidal.

Core 101 may be made from any suitable inorganic material, such as but not limited to inorganic materials having a refractive index ranging from greater than or equal to about 1.5, greater than or equal to about 1.7, greater than or equal to about 2.0, or even greater than or equal to about 2.4. Non-limiting examples of such materials include aluminum nitride, aluminum oxide, cadmium telluride, barium titanate, titanium dioxide, zirconium dioxide, zinc sulfide, combinations thereof, and the like.

Any type of polymeric material may be used to form shell 102, so long as it is capable of bonding or otherwise adhering to the surface of core 101. Non-limiting examples of such materials include acrylic polymers such as but not limited to poly (methyl methacrylate ("PMMA"), poly(methyl acrylate) ("PMA"), poly(butyl acrylate) ("PBA"), and poly(hydroxyethyl methacrylate; polystyrene; styrene copolymers such as but not limited to poly(butadiene-co-styrene) and poly(acrylonitrile-co-butadiene-co-styrene); polysiloxanes; polyethylene; polypropylene; combinations thereof, and the like. In some embodiments, shell 102 is formed by covalently bonding one or more of the aforementioned materials to the surface of core 101.

As specific non-limiting examples of core-shell particles consistent with the present disclosure, mention is made of particles formed from titanium dioxide cores and a poly(methyl methacrylate) shells, zirconium dioxide cores and poly (dimethyl siloxane) shells, zirconium dioxide cores and poly (methylphenyl siloxane-co-dimethylsiloxane) shells; and zirconium dioxide cores and poly(methylphenyl siloxane) shells. Such core-shell particles may be understood as exhibiting a refractive index that is higher than the refractive index of the shell material itself. In the case of the zirconia based core-shell particles, such particles may also exhibit relatively high thermal stability and good compatibility with a silicone-based casting resins that are employed in light emitting diode manufacturing. Other specific non-limiting examples of core-shell particles consistent with the present disclosure include particles formed from aluminum oxide or aluminum nitride cores, and polysiloxane shells. Such particles may be exhibit a thermal conductivity that is higher than the thermal conductivity of the polymeric material forming the shell itself. As still further specific non-limiting examples of core-shell particles consistent with the present disclosure, mention is made of core-shell particles formed from barium titanate or strontium titanate cores, and polystyrene shells. Such particles exhibit dielectric permittivity that differs from the dielectric permittivity of the shell material itself.

Core-shell particles consistent with the present disclosure may be formed by a number of different methods, including so-called "grafting from" and "grafting to" methods. In either method, polymer chains are grafted onto the surface of particulate materials that ultimately form the core of the resulting core-shell particles. In the "grafting from" method, monomer units of the polymeric material diffuse to propagating sites on the surface of the nanoparticle, where they polymerize using one or more surface-initiated polymerization techniques such but not limited to as atom-transfer radical polymerization (ATRP), nitroxide-mediated polymerization (NMP), and reversible addition-fragmentation chain transfer (RAFT). In contrast, the grafting to method involves coupling polymer chains with an active terminal group to active sites on the surface of a nanoparticle. Various "grafting to" mechanisms are known, and include so-called "click" chemistry in which macromolecules such as polymers may be immobilized on the surface of particles such as nanoparticles.

As one non-limiting example of a suitable grafting to method that may be used to form core-shell particles consistent with the present disclosure, mention is made of the Cu(I)-catalyzed azide-alkyne cycloaddition click reaction, which has been widely used to immobilize macromolecules on the surface of particles. In general, such a reaction involves functionalizing the surface of particles with an azide ligand (such as but not limited to a phosphoazide ligand), and reacting the azide functional groups in the ligand with an alkyne terminated polymer. The chemistry of this approach is well understood and described in Tchoul et al., "Assemblies of Titanium Dioxide-Polystyrene Hybrid Nanoparticles for Dielectric Applications," Chemistry of Materials, Vol. 22, pp. 1749-1759 (2010), the entire contents of which is incorporated herein by reference.

Both the grafting to and grafting from techniques may be used to form core-shell particles consistent with the present disclosure. In some embodiments, however, the grafting from technique is preferred because of the mild reaction conditions of that method, and the fact that core-shell particles resulting from such a method may be less likely to agglomerate than core-shell particles produced using the grafting to technique.

Figure 2:
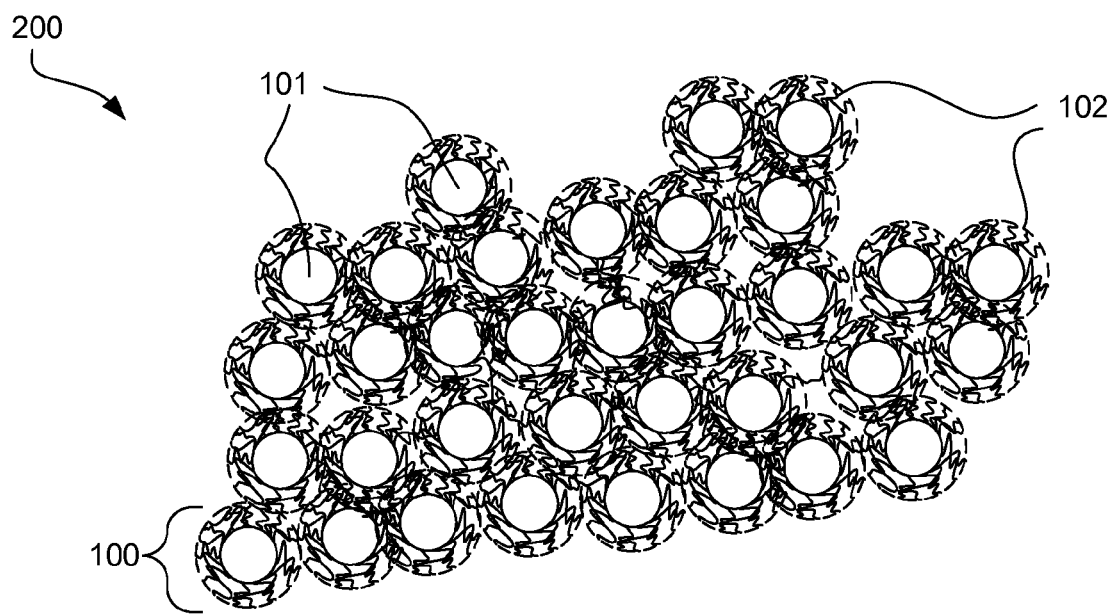
FIG. 2 illustrates in cross section an exemplary core-shell particle assembly consistent with the present disclosure

Core-shell particles consistent with the present disclosure may be formed into a matrix free assembly, i.e., a core-shell particle assembly. Reference is therefore made to FIG. 2, which illustrates an exemplary core-shell particle assembly consistent with the present disclosure. As shown, core-shell particle assembly 200 includes a plurality of core-shell particles 100, each of which includes a core 101 and shell 102, as previously described. In FIG. 2, core-shell particle assembly 200 is illustrated as containing a plurality of core-shell particles 100, each of which includes a shell 102 that overlaps with a shell 102 of at least one adjacent core-shell particle 100. In this regard, core-shell particle assembly 200 may be understood as including a plurality of core-shell particle assemblies that are bound or otherwise held together by the entanglement of polymer chains 102 of constituent core-shell particles 100. Of course, this configuration is exemplary only, and core-shell particles 100 may be bound or otherwise held together by another mechanism, such as chemical or physical bonding.

Core-shell particle assembly 200 may be in the form of a coating, free-standing film, plate, or the like, as will be discussed later in connection with FIGS. 5A and 5B. In some non-limiting embodiments, core-shell particle assembly 200 is in the form of a coating or free-standing film.

Core-shell particle assemblies consistent with the present disclosure may be manufactured using any suitable method. In one non-limiting example of such a method, core-shell particle assemblies consistent with the present disclosure may be formed by dispersing core-shell particles in an appropriate solvent, and then allowing the solvent to evaporate. Suitable solvents for this purpose include organic solvents, such as but not limited to chlorobenzene, ethylbenzene, hexane, methyl ethyl ketone, toluene, tetrahydrofuran, combinations thereof, and the like. Although not required, in some embodiments dispersing core-shell particles in an organic solvent may cause a soluble fraction of the core-shell particle (e.g., all or a portion of the polymer chains) to dissolve into solution. In some embodiments, core-shell particle assemblies consistent with the present disclosure are formed by dispersing core-shell particles in chlorobenzene, depositing the resulting dispersion/solution onto a substrate, and allowing all or substantially all of the chlorobenzene to evaporate.

Core-shell particles that are relatively small in size (diameter generally less than or equal to 100 nm) can interact with light as a uniform particle with an effective refractive index that is a combination of the refractive index of the core and the refractive index of the shell. In such instances, the effective refractive index of the core-shell particle may be calculated by applying the rule of mixtures and formula (I) below:

$$n_{c-s} = (n_c - n_s)\frac{r^3}{(r+t)^3} + n_s \quad (I)$$

Wherein: $n_{c-s}$, $n_c$ and $n_s$ are the refractive indices of the core-shell particle, the core, and the shell, respectively; r is the radius of the core; and t is the thickness of the shell.

Although formula (I) can accurately calculate the effective refractive index of a core-shell particle, the refractive index of a core-shell particle assembly differs from that of the calculated effective refractive index of its constituent core-shell particles. Indeed, the effective refractive index of a core-shell particle assembly may be derived by calculating the dielectric constant of the core-shell particle assembly and converting it to refractive index. In this regard, the dielectric constant of a core-shell particle assembly may be calculated using the Maxwell-Garnett equation shown in formula (II) below:

$$\epsilon_a = \epsilon_s\left(1 + 3\frac{X_v x'}{1 - X_v x'}\right) \quad (II)$$

wherein: $\epsilon_a$, $\epsilon_s$, are the dielectric constants of the core-shell particle assembly and the dielectric constant of the shell, respectively; $X_v$ is the volume fraction of the shell; and x' is defined by equation (III) below:

$$x' = \frac{1}{3}(\epsilon_c - \epsilon_s) \bigg/ \left(\epsilon_c - \frac{1}{3}(\epsilon_c - \epsilon_s)\right) \quad (III)$$

wherein $\epsilon_c$ is dielectric constant of the material of the core. The refractive index of the core-shell particle assembly may then be calculated using formula (IV) below:

$$n_a = \sqrt{(\epsilon_a)}$$

where $n_a$ the refractive index of the core-shell particle assembly.

From formulas (II)-(IV) above, it may be understood that the refractive index of a core-shell particle assembly may be adjusted by controlling the volume fraction of the core of its constituent core-shell particles, relative to the total volume of each core-shell particle. The volume fraction of the core may be controlled by any suitable method. For example, the volume fraction of the core in a core-shell particle may be adjusted by altering the thickness of the shell while holding the size of the core or by altering the size of the core while holding the thickness of the shell constant.

Figure 3:
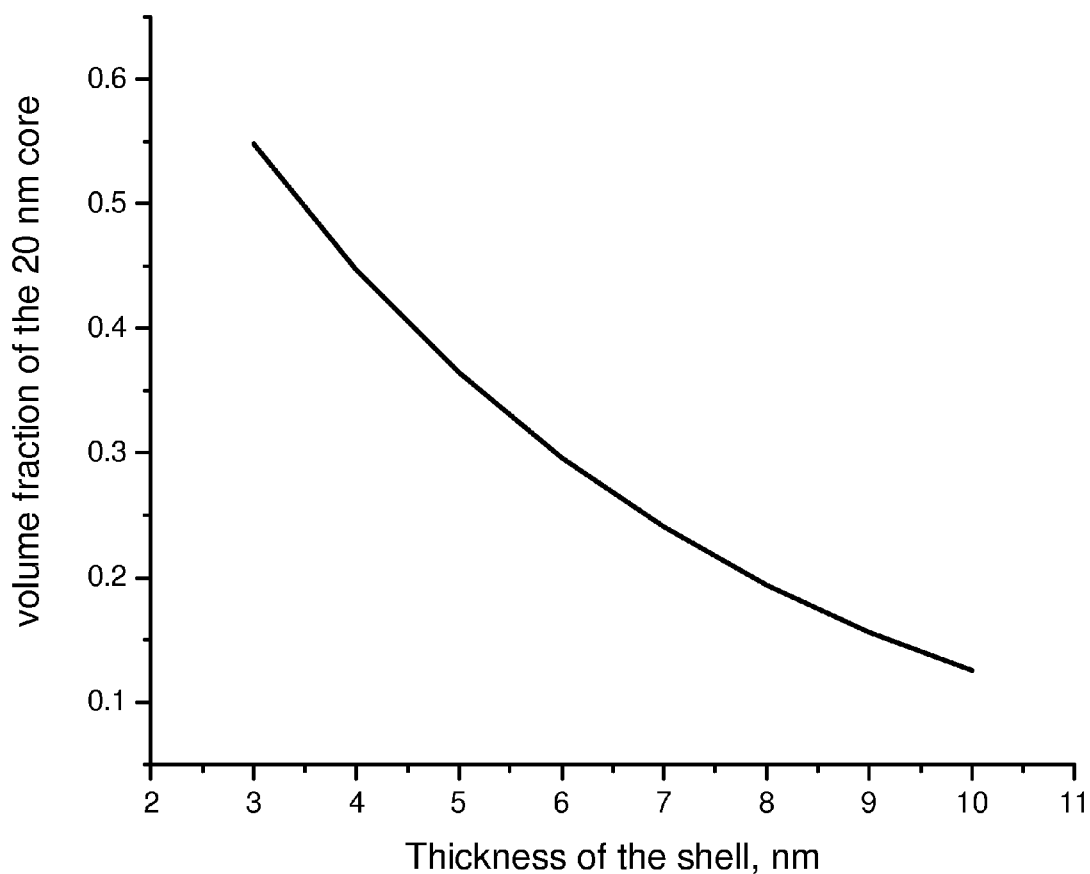
FIG. 3 is a plot of core volume fraction vs. shell thickness for core-shell particles with a core diameter of 20 nm and a variable shell thickness.

To illustrate this concept, reference is made to FIG. 3, which plots the calculated volume fraction of core-shell particles having a 20 nm diameter core and shells of varying thickness. As shown, the volume fraction of the 20 nm core decreases as the thickness of the shell increases, and vice versa. A similar trend would be expected if the core diameter was varied while the shell thickness was held constant, i.e., core volume fraction would increase with increasing core diameter, and decrease with decreasing core diameter.

Figure 4:
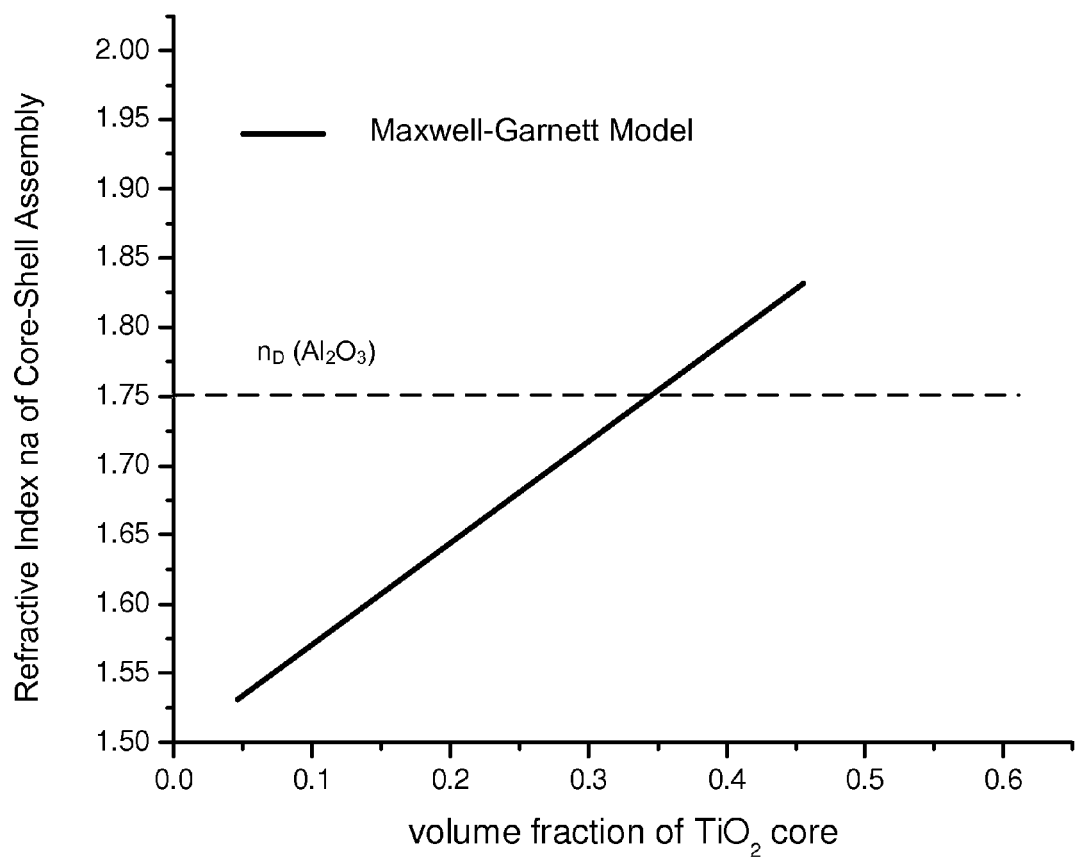
FIG. 4 is a plot of calculated refractive index vs. core volume fraction for core-shell assemblies that include core-shell particles having a titanium dioxide cores and poly(methyl methacrylate) shells.

FIG. 4 plots the calculated refractive index vs. core volume fraction for a core-shell particle assembly formed from core-shell particles having titanium dioxide ($TiO_2$) cores with a refractive index of 2.4 and poly(methyl methacrylate) shells with a refractive index of 1.5. The refractive index was derived using the Maxwell-Garnett equation, i.e., using equations (II)-(IV) above. As shown, the calculated refractive index of the core-shell particle assembly increases with increasing core volume fraction, and decreases with decreasing core volume fraction.

For the sake of illustration, FIG. 4 includes a line delineating the refractive index ($n_D$) of alumina, which is 1.75. As shown, the calculated refractive index of the core-shell particle assembly equals the refractive index of alumina when the volume fraction of the titanium cores in the core-shell particle assembly is approximately 35%. This suggests that a composite having the same or substantially the same optical transparency as the core-shell particle assembly could be formed by adding alumina particles to the core-shell particle assembly when the core-shell particle assembly includes titanium cores with a core volume fraction of about 35%. Due to alumina's high thermal conductivity (relative to the core-shell particle assembly), the alumina addition could enhance the thermal conductivity, without or without substantially affecting the optical transparency of the composite.

In view of the foregoing, the present disclosure contemplates composites that include a matrix component formed from at least one core-shell particle assembly, and at least one filler. Without limitation, the filler may be selected to provide desired properties to the composite, such as thermal conductivity, wavelength-conversion capability, dielectric permittivity, combinations thereof, and the like, while retaining or substantially retaining the optical transparency of the core-shell particle assembly.

In this regard, the core-shell particle assembly matrix may be understood as having a first optical transparency, which may be any desired value. For example, the first optical transparency may range from about 50% to 100% of incident light of a first wavelength range, such as about 75% to about 100%, about 80% to about 100%, about 90% to about 100%, about 95% to about 100%, or even about 100%. In some embodiments, the core-shell particle assembly matrix may be 100% transparent to incident light of the first wavelength range.

Without limitation, the first wavelength range may correlate to the wavelength or wavelengths of light output by a light source such an LED, e.g., as primary light. Thus for example, the first wavelength range may be the visible region (i.e., about 400 nm to about 760 nm), ultraviolet region (i.e., about 100 nm to about 40 nm), near infrared region (about 760 to about 2500 nm), or far infrared region (about 2500 nm to about 10,000 nm) of the electromagnetic spectrum, portions thereof, combinations thereof, and the like. In some embodiments, the specified wavelength range correlates to blue light in the visible region of the spectrum, i.e., from about 400 nm to about 500 nm, such as about 475 nm.

The composites of the present disclosure may exhibit the same or substantially the same optical transparency as the core-shell particle assembly matrix, regardless of the presence of the filler. Accordingly, the composites described herein may be understood as having a second optical transparency to incident light of the specified wavelength range that differs from the first optical transparency by less than or equal to about 20%, such as less than or equal to about 15%, less than or equal to about 10%, less than or equal to about 5%, or less than or equal to about 1%. In some embodiments, the second optical transparency equals or substantially equals the first optical transparency.

As noted previously, the filler materials may be selected so as to provide desired properties to the composites described herein, such as thermal conductivity or wavelength converting properties. Accordingly, the fillers described herein may be in the form of particles that may be loaded, embedded, or otherwise adhered to a core-shell particle assembly consistent with the present disclosure.

In some embodiments, the filler material included in the composites of the present disclosure is chosen from materials having a thermal conductivity that is higher or lower than the thermal conductivity of a core-shell particle assembly matrix. In instances where the thermal conductivity of the filler exceeds that of a core-shell particle assembly matrix, the resulting composite may exhibit a thermal conductivity that is greater than that of the core-shell particle assembly matrix. Similarly, in instances where the thermal conductivity of the filler is less than that of a core-shell particle assembly matrix, the resulting composite may exhibit a thermal conductivity that is lower than the core-shell particle assembly matrix. Thus, appropriate selection of a filler material can raise or lower the thermal conductivity of a composite, relative to the thermal conductivity of the core-shell particle assembly matrix component of the composite. This may allow the composite to act as a thermal insulator or conductor, as the case may be.

In some embodiments, the filler material is chosen from particulate materials having a higher thermal conductivity than a core-shell particle assembly matrix. In some embodiments, the filler(s) have a thermal conductivity ranging from about 25% or more, such as about 50% or more, about 85% or more, about 95% or more, or even about 99% or more than the thermal conductivity of a core-shell particle assembly matrix. With this in mind, non-limiting examples of fillers having desirable thermal conductivity for use in the composites described herein include aluminum oxide ($Al_2O_3$; thermal conductivity of about 30 to about 36 W/m-K), yttrium aluminum garnet (YAG; thermal conductivity of about 13 W/m-K), zirconium oxide ($ZrO_2$; thermal conductivity of about 1 to 2 W/m-K); and titanium dioxide ($TiO_2$; thermal conductivity of about 11-13 W/m-K).

Put in other terms, the composites of the present disclosure may exhibit a thermal conductivity ranging from about 1 to about 40 W/m-K, such as about 5 to about 40 W/m-K, about 10 to about 36 W/m-K, or even about 12 to about 20 W/m-K. Of course, composites exhibiting thermal conductivities falling within, above, or below such ranges may be used, and are contemplated herein. In contrast, a core-shell particle assembly matrix consistent with the present disclosure may exhibit a thermal conductivity of less than or equal to about 1 W/m-K.

As noted previously, the composites described herein may include at least one filler material having wavelength conversion properties, i.e., the capability to convert incident primary light to secondary light. Non-limiting examples of such wavelength-converting fillers include yellow phosphor, green phosphor, red phosphor, and combinations thereof. Further non-limiting examples of such materials include oxyfluorates, nitrides (including oxynitride phosphors), and oxide phosphors (for example aluminate garnets, silicates etc), including those containing cerium, gadolinium, scandium, europium, and/or other elements. In some embodiments, the filler is chosen from cerium-activated yttrium aluminum garnets (YAG:Ce); cerium-activated yttrium gadolinium aluminum garnets (YGdAG:Ce); cerium-activated lutetium aluminum garnets (LuAG:Ce); europium-activated alkaline earth (AE) silicon oxynitride (AE-SiON:Eu), where AE designates at least one element selected from Ba, Sr, and Ca; europium-activated metal SiAlON (M-SiAlON:Eu), where M is chosen from alkali ions, rare earth ions, alkaline earth ions, Y, and Sc; variations and combinations thereof, and the like. Elements such as cerium or europium may be understood to be 'activators' of the conversion material (i.e., the elements largely responsible for light absorption and emission in the conversion material), and may be referred to as such in this application.

The particle size of the filled materials used herein may vary widely. For example, the particle size of the filler may range from about 100 nm to about 0.5 mm, such as about 0.001 mm to about 0.25 mm, or even about 0.001 mm to about 0.1 mm Of course, such ranges are exemplary only, and fillers having any suitable particle size may be used.

The composites described herein may include the aforementioned filler(s) in any desired amount. In some embodiments, one or more fillers are present in the composite in an amount ranging from greater than 0 to about 70 weight %, such as about 1 to about 60 weight %, about 5 to about 50 weight %, about 10 to about 40 weight %, or even about 10 to about 35 weight %, relative to the total weight of the composite. Of course, such ranges are exemplary only, and filler loadings below, above, and within the aforementioned ranges are contemplated by the present disclosure. Without limitation, the amount of filler in the composite may affect the degree to which the properties of the filler are exhibited by the composite. For example, composites with high filler loadings may more strongly exhibit properties of the filler than composites with lower filler loadings.

Regardless of the nature of the filler, the filler material may exhibit a first refractive index falling within any desired range. In some embodiments, the first refractive index of the filler ranges from about 1.0 to about 2.5, such as about 1.3 to about 2.4, about 1.5 to about 2.0, or even about 1.5 to about 1.8. In further non-limiting embodiments, the first refractive index of the filler ranges from about 1.5 to about 2.4, such as about 1.5 to about 2.2, about 1.5 to about 2.0, about 1.5 to about 1.9, or even about 1.5 to about 1.7.

It is known from optical physics that light may be significantly scattered and/or diffusely reflected by an article that is made from two different materials of differing refractive index. With this in mind, the present disclosure contemplates composites that include at least one filler having a first refractive index, and a core-shell particle assembly matrix having a second refractive index that matches or substantially matches the first refractive index. Index matching of the core-shell particle assembly and filler may be accomplished, for example by adjusting the core volume fraction of core-shell particles, resulting in a corresponding adjustment to the refractive index of the core-shell particle assembly in which the core-shell particles are included.

Thus for example, the core-shell particle assemblies of the present disclosure may exhibit a second refractive index that differs from the first refractive index of a filler by less than or equal to about 10%, such as less than or equal to about 5%, less than or equal to about 1%, or less than or equal to about 0.1%. In some embodiments, the second refractive index of the core-shell particle assembly equals the first refractive index of the filler.

As noted previously, the core-shell particle assemblies of the present disclosure may transmit a desired quantity of light in a first wavelength range, e.g., about 50% to 100%, such as about 75% to about 100%, about 80% to about 100%, about 90% to about 100%, about 95% to about 100%, or even about 100% of incident light in the first wavelength range. By matching or substantially matching the refractive indices of the core-shell particle assembly and filler, the composites of the present disclosure may maintain or substantially maintain this level of optical transparency despite the presence of the filler material. In other words, the present disclosure envisions composites that are optically transparent to light in the first wavelength range, and which also exhibit desired properties due to the presence of a filler material. In some embodiments, the optical transparency of the composites described herein differs from that of the core-shell particle assembly matrix used in the composite by less than or equal to about 20%, less than or equal to about 10%, less than or equal to about 5%, or less than or equal to about 1%. In some embodiments, the optical transparency of the composite equals to the optical transparency of the core-shell particle assembly used in the composite, with respect to light in the first wavelength.

As a specific non-limiting example of a composite consistent with the present disclosure, mention is made of composites that include a core-shell particle assembly matrix formed from core-shell particles having a titanium dioxide core and poly(methyl methacrylate) shell with a core volume fraction of about 35%, which is loaded with aluminum oxide ($Al_2O_3$) particles, as discussed above in connection with FIG. 4. Further non-limiting examples of such composites include, a core-shell particle assembly matrix formed from core-shell particles with zirconium dioxide cores and poly(methylphenyl siloxane) shells with volume fraction of the core of 35% and loaded with aluminum oxide, and a core-shell particle assembly matrix formed from core-shell particles with zirconium dioxide cores and poly(methylphenyl siloxane) shells with a volume fraction of the core of 50%, loaded with yttrium aluminum garnet-based luminescent particles.

As noted previously, the fillers described herein may be dispersed, embedded, or otherwise included in the core-shell particle assembly matrices described herein. Such composites may be manufactured by any suitable method. For example, one or more fillers may be dispersed in a core-shell particle assembly matrix by dispersing core-shell particles and filler material particles in a solvent, casting the resulting mixture/solution onto a substrate, and allowing the solvent to evaporate. Alternatively or additionally, one or more fillers may be dispersed in a core-shell particle assembly by mixing, e.g., adding filler particles to a core-shell particle assembly cast on a substrate prior to the evaporation of a solvent. Alternatively or additionally, one or more fillers may be embedded into a core-shell particle assembly, e.g., by spraying particles of filler onto a dry or partially dry core-shell particle assemblies such that they embed into the surface thereof.

Figure 5A:
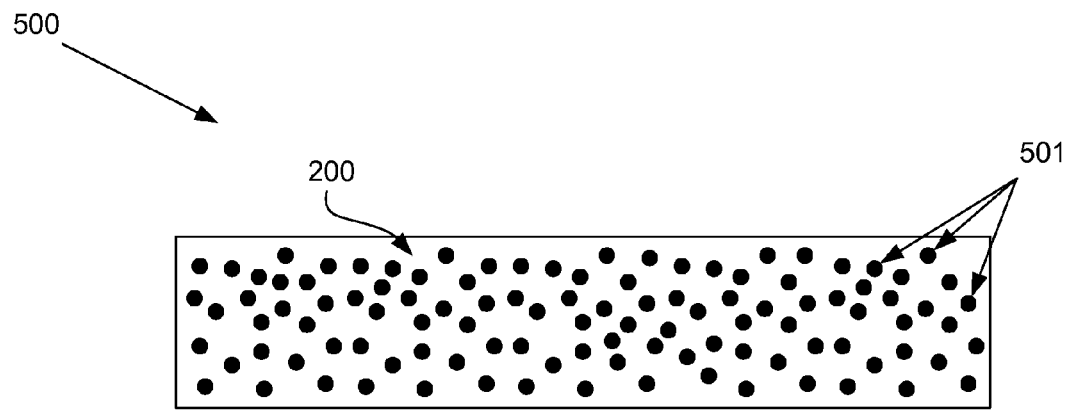
FIGS. 5A and 5B diagrammatically illustrate the structure of exemplary composites in accordance with the present disclosure.

Reference is now may to FIGS. 5A and B, which illustrate the structure of exemplary composites consistent with the present disclosure. As shown, composite 500 includes core-shell particle assembly 200 and a plurality of filler particles 501. The nature and composition of such components has been previously described, and so is not reiterated herein for the sake of brevity.

Figure 5B:
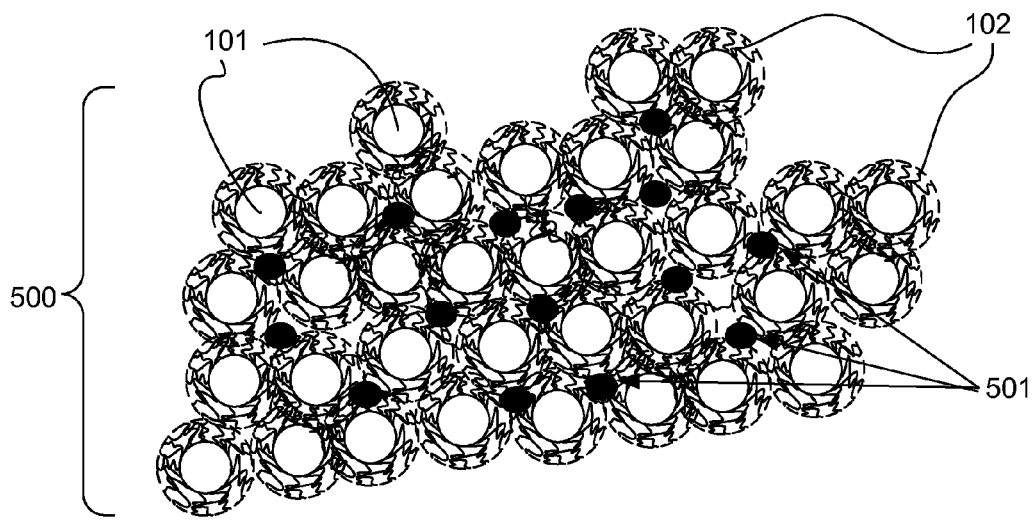

As shown in FIG. 5B, filler particles 501 may be present within or bounded by the polymeric materials forming shells 102 of the core-shell particles making up core-shell particle assembly 200. In some embodiments, filler particles 501 are present in the interstices (i.e., spaces) between core-shell particles making up core-shell particle assembly 200. Alternatively or additionally, filler particles 501 may be contained within, embedded, or otherwise bounded by polymer chains 102 of the core-shell particles included in core-shell particle assembly 200.

Although FIGS. 5A and 5B illustrate composite 500 as including a relatively homogenous distribution of filler particles 501, such distribution is not required. Indeed, filler particles 501 may be distributed within core-shell particle assembly 200 in and desired fashion. For example, filler particles may be distributed homogeneously, inhomogenously, irregularly, in a fixed or variable pattern, and the like on or within core-shell particle assembly 200.

Because the composites described herein may be optically transparent while exhibiting desirable properties such as wavelength conversion capability and/or thermal conductivity, they may be useful for various applications, including lighting applications. Accordingly, another aspect of the present disclosure relates to light sources that include a composite consistent with the present disclosure. Although the present disclosure contemplates the use of such composites for any lighting application, such composites may be particularly suited for use as or in heat distribution structures, adhesives, and/or wavelength-converting structures in a lamp, such as an LED light source. For example, composites described herein that contain a thermally conductive filler may be suitable for use as an adhesive for mounting a wavelength-converting plate to a light emitting diode. Alternatively or additionally, composites that include a filler with wavelength converting properties may be suitable for use as a wavelength conversion structure for converting primary light (e.g., emitted from an LED) to secondary light. Composites containing both thermally conductive filler and wavelength converting filler may also be suitable for use in or as a wavelength converting structure. In this regard, reference is made to FIGS. 6A and 6B, which depict exemplary LED lighting sources that include a composite in accordance with the present disclosure.

Figure 6A:
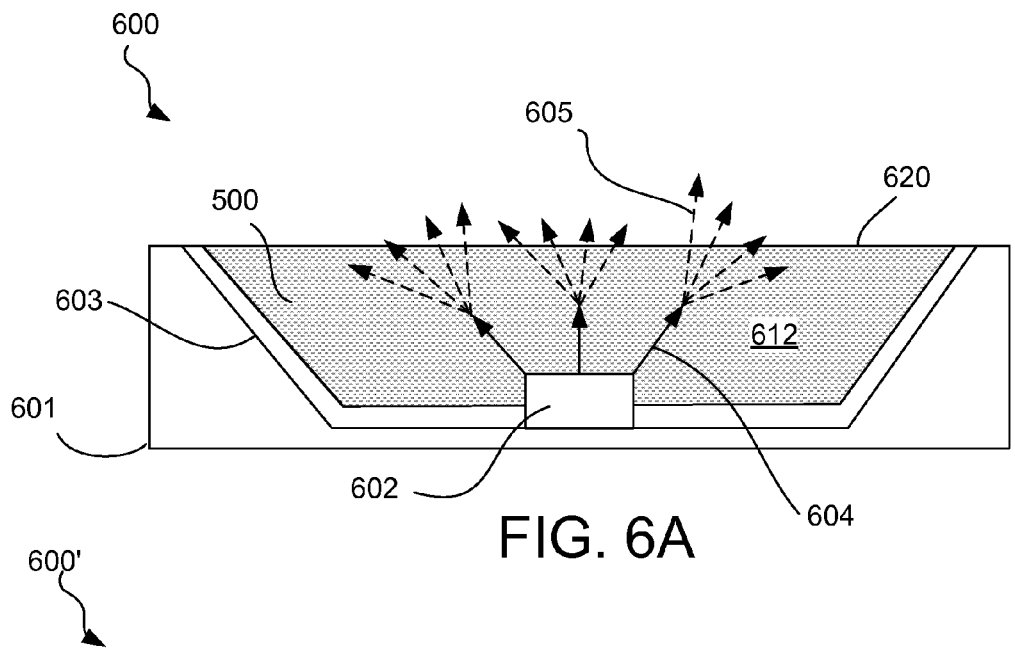
FIGS. 6A and 6B diagrammatically illustrate in cross section light emitting diode (LED) light sources that include a composite in accordance with the present disclosure.

As shown in FIG. 6A, LED light source 600 includes LED frame 601, LED 602, optional reflector 603 and composite 500. LED frame 601 includes a cavity 612 in which LED 602 is disposed. When used, optional reflector 603 is disposed about LED 602 and between frame 601 and composite 500, and may function to reflect backscattered light.

LED frame 601 may be any frame that is suitable for supporting LED 602, optional reflector 603, and composite 500. In some embodiments, LED frame 601 may be circuit board containing electrical circuits, contacts, etc. for driving LED 602. Alternatively or additionally, LED frame 601 may be a support structure that provides mechanical support for other components in LED light source 600.

LED 602 may be any LED that is capable of emitting primary light from a light emitting surface thereof. Although LEDs that emit primary light in the blue region of the electromagnetic spectrum are preferred, LEDs that emit primary light in other regions of the spectrum may also be used.

Regardless of its nature, LED 602 may emit primary light 604 from an emitting surface thereof (not labeled). Primary light 604 may be emitted from LED 602 in any direction, but preferably towards the aperture 620 of LED light source 600. Subsequent to emission by LED 602, primary light 604 may impinge on composite 500.

As described previously, composite 500 may include at least one core-shell particle assembly as a matrix for a filler material, such as a wavelength conversion material. Accordingly, composite 500 in FIGS. 6A and 6B may be understood as including particles of wavelength-converting materials that are capable of converting primary light 604 to secondary light 605. For example, composite 500 may include a core-shell particle assembly formed from core-shell particles, and at least one particulate filler materials chosen from phosphors and/or other wavelength conversion materials, as previously described. Alternatively or additionally, composite 500 may include filler particles having high thermal conductivity, thus improving the ability of composite 500 to conduct and/or dissipate heat.

Figure 6B:
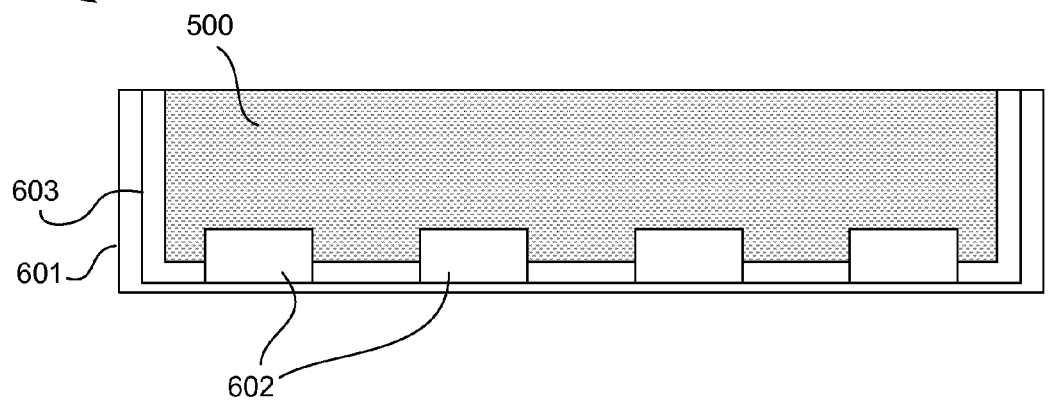

In the examples shown in FIGS. 6A and 6B, composite 500 is depicted as a being in the form of a conformal layer that is in contact with LED 602. As such, FIGS. 6A and 6B may be understood as depicting the use of composite 500 in a chip level conversion configuration, when composite 500 includes wavelength converting material as a filler. This configuration is exemplary only, and it should be understood that composite 500 may be placed and/or configured in another manner. For example, composite 500 may be placed remotely from the surface of LED 602, e.g., in a remote phosphor configuration.

FIG. 6B. illustrates another exemplary LED light source including a composite consistent with the present disclosure. As shown, LED light source 600' includes LED frame 601, LEDs 602, optional reflector 603, and composite 500. Apart from the use of multiple LEDs 602 and the distribution of optional reflector 603 and composite 500 between such LEDs, the nature and function of the components of LED light source 600' is the same as the similarly numbered components in FIG. 6A. The operation and configuration of such components is therefore not reiterated.

While the principles of the present disclosure have been described herein, it is to be understood by those skilled in the art that this description is made only by way of example and not as a limitation as to the scope of the claimed invention. The features and aspects described with reference to particular embodiments disclosed herein are susceptible to combination and/or application with various other embodiments described herein. Such combinations and/or applications of such described features and aspects to such other embodiments are contemplated herein. Modifications and other embodiments are contemplated herein and are within the scope of the present disclosure.

What is claimed is:

1. A composite, comprising a matrix and a filler, wherein:
said matrix comprises a core-shell particle assembly comprising core-shell particles, said core-shell particles comprising an inorganic core and a polymeric shell, said core-shell particle assembly independently exhibiting a refractive index $n_1$ for light in a first wavelength range;
said at least one filler comprises particles of at least one material, said particles being incorporated into said matrix, embedded into a surface of said matrix, or a combination thereof; and
said filler independently exhibiting a refractive index $n_2$ for light in said first wavelength range, wherein $n_1$ differs from $n_2$ by less than or equal to about 10% and said filler is a wavelength-conversion material is selected from a cerium-activated yttrium aluminum garnet (YAG:Ce), a cerium-activated yttrium gadolinium aluminum garnet (YGdAG:Ce), a cerium-activated lutetium aluminum garnet (LuAG:Ce), a europium-activated alkaline earth (AE) silicon oxynitride (AE-SiON:Eu), where AE designates at least one element selected from Ba, Sr, and Ca, or a europium-activated metal SiAlON (M-SiAlON:Eu), where M is chosen from alkali ions, rare earth ions, alkaline earth ions, Y, and Sc.

2. A composite, comprising a matrix and a filler, wherein:
said matrix comprises a core-shell particle assembly comprising core-shell particles, said core-shell particles comprising an inorganic core and a polymeric shell, said core-shell particle assembly independently exhibiting a refractive index $n_1$ for light in a first wavelength range;
said at least one filler comprises particles of at least one material, said particles being incorporated into said matrix, embedded into a surface of said matrix, or a combination thereof and
said filler independently exhibiting a refractive index $n_2$ for light in said first wavelength range, wherein $n_1$ differs from $n_2$ by less than or equal to about 10% and said filler is selected from $Al_2O_3$, yttrium aluminum garnet, $ZrO_2$, $TiO_2$, and combinations thereof.

3. A composite, comprising a matrix and a filler, wherein:
said matrix comprises a core-shell particle assembly comprising core-shell particles, said core-shell particles comprising an inorganic core and a polymeric shell, said core-shell particle assembly independently exhibiting a refractive index $n_1$ for light in a first wavelength range;
said at least one filler comprises particles of at least one material, said particles being incorporated into said matrix, embedded into a surface of said matrix, or a combination thereof, and
said filler independently exhibiting a refractive index $n_2$ for light in said first wavelength range, wherein $n_1$ differs from $n_2$ by less than or equal to about 10% and said core of said core-shell particles is formed from aluminum nitride, aluminum oxide, cadmium telluride, barium titanate, titanium dioxide, zirconium dioxide, zinc sulfide, or a combination thereof.

4. A composite, comprising a matrix and a filler, wherein:
said matrix comprises a core-shell particle assembly comprising core-shell particles, said core-shell particles comprising an inorganic core and a polymeric shell, said core-shell particle assembly independently exhibiting a refractive index $n_1$ for light in a first wavelength range;
said at least one filler comprises particles of at least one material, said particles being incorporated into said matrix, embedded into a surface of said matrix, or a combination thereof and
said filler independently exhibiting a refractive index $n_2$ for light in said first wavelength range, wherein $n_1$ differs from $n_2$ by less than or equal to about 10% and said polymeric shell is formed from polymers or copolymers of at least one acrylate, olefin, siloxane, styrene, and combinations thereof.

5. A composite, comprising a matrix and a filler, wherein:
said matrix comprises a core-shell particle assembly comprising core-shell particles, said core-shell particles comprising an inorganic core and a polymeric shell, said core-shell particle assembly independently exhibiting a refractive index $n_1$ for light in a first wavelength range;
said at least one filler comprises particles of at least one material, said particles being incorporated into said matrix, embedded into a surface of said matrix, or a combination thereof and
said filler independently exhibiting a refractive index $n_2$ for light in said first wavelength range, wherein $n_1$ differs from $n_2$ by less than or equal to about 10% and said polymeric shell comprises polymers or copolymers selected from the group consisting of poly(methyl methacrylate), poly(methyl acrylate), poly(butyl acrylate), poly(hydroxyethyl methacrylate, polystyrene, poly(butadiene-co-styrene), poly(acrylonitrile-co-butadiene-co-styrene), polysiloxanes, polyethylene, polypropylene, and combinations thereof.

6. A light emitting diode (LED) light source comprising:
a LED configured to emit primary light in a first wavelength range from an emitting surface thereof; and
a composite disposed in proximity to said LED, such that said primary light is incident on a surface thereof, said composite comprising a matrix and a filler, wherein:
said matrix comprises a core-shell particle assembly comprising core-shell particles, said core-shell particles comprising an inorganic core and a polymeric shell, said core-shell particle assembly independently exhibiting a refractive index $n_1$ for light in said first wavelength range;
said at least one filler comprises particles of at least one material, said particles being incorporated into said matrix, embedded into a surface of said matrix, or a combination thereof; and
said filler independently exhibits a refractive index $n_2$ for light in said first wavelength range, wherein $n_1$ differs from $n_2$ by less than or equal to about 10%.

7. The light emitting diode light source of claim 6, wherein said filler has a thermal conductivity exceeding that of the matrix.

8. The light emitting diode light source of claim 6, wherein said filler is a wavelength-conversion material.

9. The light emitting diode light source of claim 8, wherein said wavelength-conversion material is selected from a cerium-activated yttrium aluminum garnet (YAG:Ce), a cerium-activated yttrium gadolinium aluminum garnet (YGdAG:Ce), a cerium-activated lutetium aluminum garnet (LuAG:Ce), a europium-activated alkaline earth (AE) silicon oxynitride (AE-SiON:Eu), where AE designates at least one element selected from Ba, Sr, and Ca, or a europium-activated metal SiAlON (M-SiAlON:Eu), where M is chosen from alkali ions, rare earth ions, alkaline earth ions, Y, and Sc.

10. The light emitting diode light source of claim 6, wherein said filler is chosen from $Al_2O_3$, yttrium aluminum garnet, $ZrO_2$, $TiO_2$, and combinations thereof.

11. The light emitting diode light source of claim 6, wherein said core of said core-shell particles is formed from aluminum nitride, aluminum oxide, cadmium telluride, barium titanate, titanium dioxide, zirconium dioxide, zinc sulfide, or a combination thereof.

12. The light emitting diode light source of claim 6, wherein said polymeric shell is formed from polymers or copolymers of at least one acrylate, olefin, siloxane, styrene, and combinations thereof.

13. The light emitting diode light source of claim 6, wherein said polymeric shell comprises polymers or copolymers selected from the group consisting of poly(methyl methacrylate), poly(methyl acrylate), poly(butyl acrylate), poly(hydroxyethyl methacrylate, polystyrene, poly(butadiene-co-styrene), poly(acrylonitrile-co-butadiene-co-styrene), polysiloxanes, polyethylene, polypropylene, and combinations thereof.

14. The light emitting diode light source of claim 6, wherein $n_1$ differs from $n_2$ by less than or equal to about 5%.

15. The light emitting diode light source of claim 6, wherein said first refractive index is adjustable by controlling the volume fraction of said core of said core-shell particles.

16. The light emitting diode light source of claim 6, wherein $n_1$ equals $n_2$.

\* \* \* \* \*